US008004838B2

(12) United States Patent
Yoshida et al.

(10) Patent No.: US 8,004,838 B2
(45) Date of Patent: Aug. 23, 2011

(54) ELECTRONIC UNIT AND IMAGE FORMING APPARATUS

(75) Inventors: Michiaki Yoshida, Niigata (JP); Koichi Tanaka, Niigata (JP)

(73) Assignee: Fuji Xerox Co., Ltd., Tokyo (JP)

( * ) Notice: Subject to any disclaimer, the term of this patent is extended or adjusted under 35 U.S.C. 154(b) by 58 days.

(21) Appl. No.: 12/550,665

(22) Filed: Aug. 31, 2009

(65) Prior Publication Data

US 2010/0124018 A1 May 20, 2010

(30) Foreign Application Priority Data

Nov. 17, 2008 (JP) ................................ P2008-293575

(51) Int. Cl.
*H05K 7/20* (2006.01)

(52) U.S. Cl. ................ 361/695; 361/679.48; 361/679.5; 361/694; 361/697; 399/90; 399/92; 165/121; 165/122

(58) Field of Classification Search ............. 361/679.46, 361/679.47, 679.48, 679.49, 679.5, 679.51, 361/690–697, 715–720; 174/16.3, 252; 454/184; 165/80.3, 104.33, 121–126, 185; 312/223.2, 312/236; 347/18, 108, 138, 152, 170, 223; 399/33, 67, 90–94, 69, 37, 88
See application file for complete search history.

(56) References Cited

U.S. PATENT DOCUMENTS

| | | | | |
|---|---|---|---|---|
| 6,266,498 | B1 * | 7/2001 | Oda et al. | 399/92 |
| 6,411,511 | B1 * | 6/2002 | Chen | 361/697 |
| 6,594,456 | B2 * | 7/2003 | Kimizuka et al. | 399/92 |
| 6,892,040 | B2 * | 5/2005 | Ahn et al. | 399/92 |
| 6,907,206 | B2 * | 6/2005 | Hattori et al. | 399/90 |
| 6,975,814 | B2 * | 12/2005 | Tsusaka et al. | 399/6 |
| 7,403,741 | B2 * | 7/2008 | Yoshihara et al. | 399/411 |
| 7,558,060 | B2 * | 7/2009 | Kiyosumi | 361/695 |
| 7,599,641 | B2 * | 10/2009 | Yoshihara et al. | 399/94 |
| 2008/0170015 | A1 | 7/2008 | Kise et al. | 345/82 |

FOREIGN PATENT DOCUMENTS

| | | |
|---|---|---|
| JP | U-2-127093 | 10/1990 |
| JP | 2006-324464 | 11/2006 |
| JP | 2008070744 A * | 3/2008 |
| JP | 2008-170658 | 7/2008 |

* cited by examiner

*Primary Examiner* — Michael V Datskovskiy
(74) *Attorney, Agent, or Firm* — Morgan, Lewis & Bockius LLP

(57) ABSTRACT

An electronic unit includes: a circuit board that has a device mounting surface mounted with circuit devices and that is supported in a condition that the device mounting surface is arranged in a direction of gravity; an opposed member that is disposed in opposition to the circuit board so that a passage space through which a refrigerant for cooling the circuit devices passes is formed between the opposed member and the device mounting surface; an exhaust unit that is disposed in opposition to the circuit devices disposed on the circuit board and that exhausts the refrigerant having passed through the passage space; and a protruding member that is provided in an upper portion of the exhaust unit in the direction of gravity and that protrudes from the opposed member toward the circuit devices.

9 Claims, 5 Drawing Sheets

E
2
13
53
22
19
3
9
8
11
8+9+11
52b
52a
52
3a
51
1
IVC
IVB
33
12a
12b
12

53
54a
54b
54c
54d
54e
52
51
3a
11
8
9
6
8+9+11
24
24a
24b
24c
17
26
12
12a
12b
2c
42
Z
(−Z)
Y
(−Y)
X
(−X)

ELECTRONIC UNIT AND IMAGE FORMING APPARATUS

CROSS-REFERENCE TO RELATED APPLICATIONS

This application is based on and claims priority under 35 USC 119 from Japanese Patent Application No. 2008-293575 filed on Nov. 17, 2008.

BACKGROUND

1. Technical Field

The present invention relates to an electronic unit and an image forming apparatus.

2. Related Art

Electronic parts and electronic devices are installed in an electronic unit for use in electronic equipment such as an image forming apparatus. Electronic parts and so on may cause operation failure due to heat generated during operation. Various techniques have been used to cool electronic parts and so on in the background art.

SUMMARY

According to an aspect of the invention, there is provided an electronic unit including: a circuit board which has a device mounting surface mounted with circuit devices and which is supported in a condition that the device mounting surface is arranged in a direction of gravity; an opposed member which is disposed in opposition to the circuit board so that a passage space through which a refrigerant for cooling the circuit devices passes is formed between the opposed member and the device mounting surface; an exhaust unit which is disposed in opposition to the circuit devices disposed on the circuit board and which exhausts the refrigerant having passed through the passage space; and a protruding member which is provided in an upper portion of the exhaust unit in the direction of gravity and which protrudes from the opposed member toward the circuit devices.

BRIEF DESCRIPTION OF THE DRAWINGS

Exemplary embodiments of the present invention will be described in detail based on the following figures, wherein:

FIGS. 4A, 4B and 4C are views showing the relationship between the circuit board and the power supply cover according to the first embodiment, in which FIG. 4A is a front view, FIG. 4B is a sectional view taken on line IVB-IVB in FIG. 4A, and FIG. 4C is a sectional view taken on line IVC-IVC in FIG. 4A; and FIGS. 5A, 5B and 5C are views showing the flow of the air according to the first embodiment and explaining the operation of the air flow, in which FIG. 5A is a view corresponding to FIG. 3, FIG. 5B is a view corresponding to FIG. 4B, and FIG. 5C is a view corresponding to FIG. 4C.

DESCRIPTION OF REFERENCE NUMERALS AND SIGNS

Figure 1:
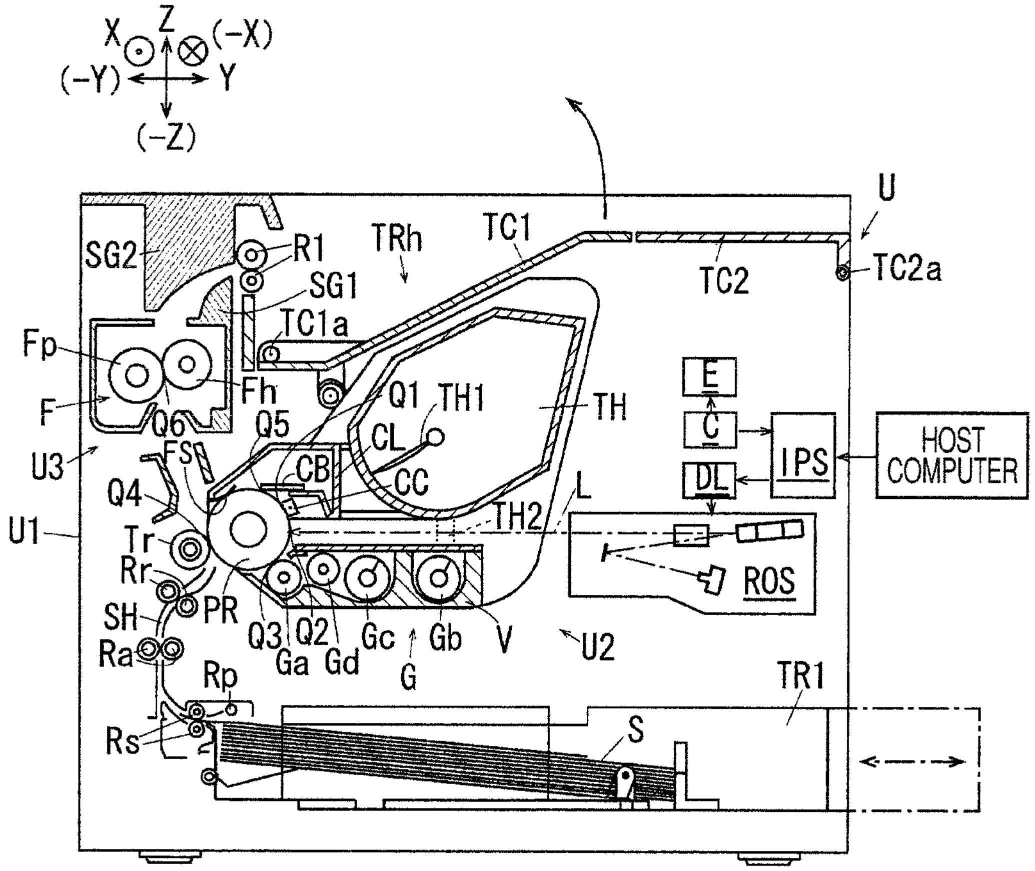
FIG. 1 is an overall view for explaining an image forming apparatus according to a first embodiment.

2 . . . circuit board, 2*a* . . . device mounting surface, 3 . . . opposed member, 6-11, 13-16, 18-23, 27-31 . . . circuit device, 8+9+11 . . . to-be-cooled device, 41 . . . circuit device group, 42 . . . circuit device group, 51 . . . exhaust unit, 52 . . . protruding member or guide member, 53 . . . passage space, E . . . electronic unit, U . . . image forming apparatus, and U2+F . . . image recording portion.

DETAILED DESCRIPTION

Although a specific embodiment (hereinafter referred to as "embodiment") of the invention will be described below with reference to the drawings, the invention is not limited to the embodiment.

In order to facilitate understanding of the following description, in the drawings, the front/rear direction is indicated as an X-axis direction, the left/right direction is indicated as a Y-axis direction and the up/down direction is indicated as a Z-axis direction, and directions or sides designated by the arrows X, −X, Y, −Y, Z and −Z are indicated as the front direction, the rear direction, the right direction, the left direction, the upper direction and the lower direction, or the front side, the rear side, the right side, the left side, the upper side and the lower side respectively.

In the drawings, each arrow with "•" written in "○" is an arrow directed from the back side of the sheet to the front side thereof and each arrow with "×" written in "○" is an arrow directed from the front side of the sheet to the back side thereof.

In the following description using the drawings, any other member than members required for description is omitted from the drawings suitably for the purpose of facilitating understanding.

First Embodiment

FIG. 1 is an overall view for explaining an image forming apparatus according to a first embodiment.

In FIG. 1, a printer U which is an example of an image forming apparatus according to the first embodiment has a printer body U1, a process cartridge U2 and a fixing unit U3. The process cartridge U2 and the fixing unit U3 are examples of removable units which are removably supported on the printer body U1.

The printer body U1 has a controller C, an image processing portion IPS, a laser drive circuit DL, a power supply unit E, etc. The controller C is an example of a control portion. The operation of the image processing portion IPS is controlled by the controller C. The laser drive circuit DL is an example of a latent image forming light drive circuit. The power supply unit E is an example of an electronic unit. For example, the power supply unit E applies voltages to a scorotron CC, a developing roller Ga, a transfer roller Tr, etc. via another power supply unit for high-voltage power supply unit. The scorotron CC is an example of a charging unit which will be described later. The developing roller Ga is an example of a developing member. The transfer roller Tr is an example of a transfer member.

The image processing portion IPS converts print information into image information for forming a latent image. The print information is given from a computer or the like as an example of an external information transmitting apparatus. The image processing portion IPS supplies the image information to the laser drive circuit DL at a predetermined timing. The laser drive circuit DL outputs a driving signal to a latent image forming unit ROS in accordance with the supplied image information.

The process cartridge U2 has an image carrier PR to be driven to rotate, the scorotron CC, a developer recovery vessel CL, a developing vessel V and a developer replenishment vessel TH. Toner as an example of a developer to be replenished is received in the developer replenishment vessel TH. The toner is agitated by an agitation member TH1 and replenished to the developing vessel V through a developer replenishment port TH2. The developing roll Ga, a pair of circulating agitation members Gb and Gc and a developer conveyance roll Gd are rotatably supported in the developing vessel V. The pair of circulating agitation members Gb and Gc circulate and convey the replenished developer while agitating the developer. The developer conveyance roll Gd is an example of a developer conveyance member for conveying the developer agitated by the circulating agitation members Gb and Gc to the developing roll Ga.

The surface of the rotary image carrier PR is charged by the scorotron CC in a charging area Q1. In a latent image forming position Q2, an electrostatic latent image is formed in the surface of the image carrier PR by a laser beam L which is an example of latent image forming light emitted from the latent image forming unit ROS. The electrostatic latent image is developed into a toner image in a developing area Q3 by the developing roll Ga. The toner image is an example of a visible image. In a transfer area Q4 which is formed out of an area where the image carrier PR is brought into pressure contact with the transfer roll Tr, the toner image is transferred to a recording sheet S by the transfer roll Tr. The recording sheet S is an example of a medium. Residual toner on the surface of the image carrier PR is removed by a cleaning blade CB in a cleaning area Q5 which is an example of a cleaning area on the downstream side of the transfer area Q4. The cleaning blade CB is an example of a cleaning member. The removed toner is recovered into the developer recovery vessel CL.

A film seal FS is provided oppositely to the cleaning blade CB. The film seal FS is an example of a littering prevention member. The film seal FS prevents the toner recovered in the developer recovery vessel CL from spilling out therefrom.

Recording sheets S are picked up from a paper feed tray TR1 in the lower portion of the printer body U1 by a pickup roll Rp. The paper feed tray TR1 is an example of a paper feed vessel. The pickup roll Rp is an example of a medium taking-out member. Each recording sheet S separated one by one by a separating roll set Rs including a retard roll and a feed roll is conveyed by sheet conveyance rolls Ra disposed along a sheet conveyance path SH. The separating roll set Rs is an example of a medium separating member. The sheet conveyance rolls Ra are examples of medium conveyance members. The recording sheet S is conveyed to the transfer area Q4 at a predetermined timing by registration rolls Rr disposed on the upstream side of the transfer area Q4 in the sheet conveyance direction. The registration rolls Rr are examples of conveyance timing adjustment members.

A transfer voltage is applied to the transfer roll Tr at a predetermined timing from the power supply unit E or the like whose operation is controlled by the controller C. The transfer roll Tr applied with the transfer voltage transfers the toner image on the image carrier PR to the recording sheet S passing through the transfer area Q4.

The recording sheet S to which the toner image has been transferred in the transfer area Q4 is conveyed to the fixing unit U3 in the condition that the toner image has not yet been fixed. The fixing unit U3 has a fixing device F consisting of a pair of fixing rolls Fh and Fp. The fixing rolls Fh and Fp are examples of fixing members. A fixing area Q6 is formed out of a pressure contact area between the pair of fixing rolls Fh and Fp. In the fixing area Q6, the toner image is fixed to the recording sheet S conveyed to the fixing unit U3 by the pair of fixing rolls Fh and Fp of the fixing device F. The recording sheet S having the fixed toner image formed thereon is guided by sheet guides SG1 and SG2 and discharged to a discharge tray TRh on the top of the printer body U1 through discharge rolls R1. The sheet guides SG1 and SG2 are examples of medium guide members. The discharge rolls R1 are examples of discharge members.

An image recording portion U2+F in the first embodiment is constituted by the process cartridge U2 and the fixing device F.

Tray covers TC1 and TC2 are supported in the upper portion of the image forming apparatus body U1 rotatably around rotation centers TC1*a* and TC2*a* respectively. The tray covers TC1 and TC2 are examples of openable covering members. The discharge tray TRh is constituted by the upper surfaces of the tray covers TC1 and TC2. The tray cover TC1 can move between an open position and a closed position. In the open position, the tray cover TC1 is opened to reveal an upper end of the image forming apparatus body U1 in order to attach/remove the process cartridge U2 to/from the image forming apparatus body U1. In the closed position, the tray cover TC1 is closed to cover the upper end of the image forming apparatus body U1.

(Description of Power Supply Unit)

Figure 2:
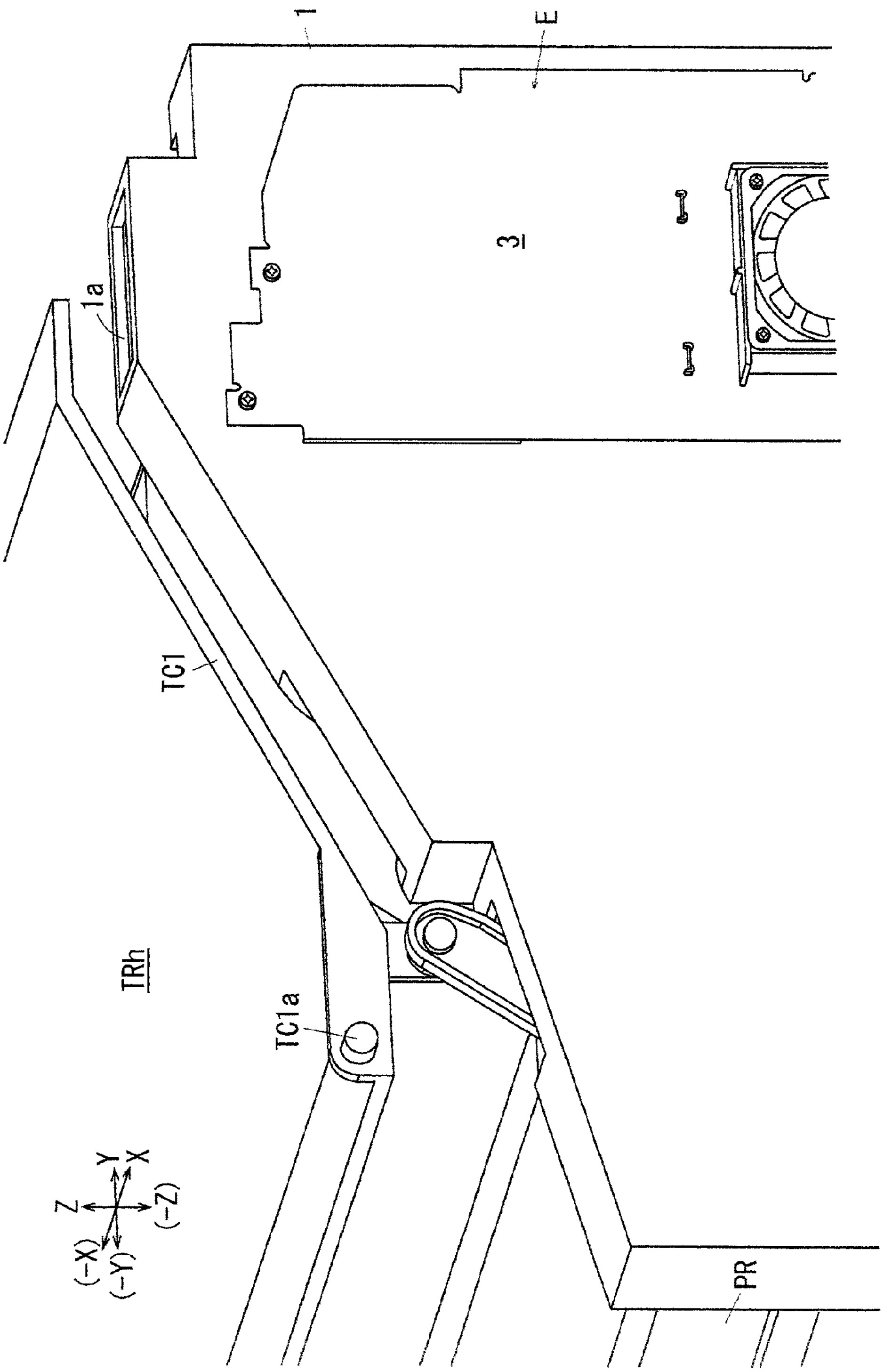
FIG. 2 is an enlarged perspective view for explaining a main portion of a printer according to the first embodiment.

FIG. 2 is an enlarged perspective view for explaining a main portion of the printer according to the first embodiment.

Figure 3:
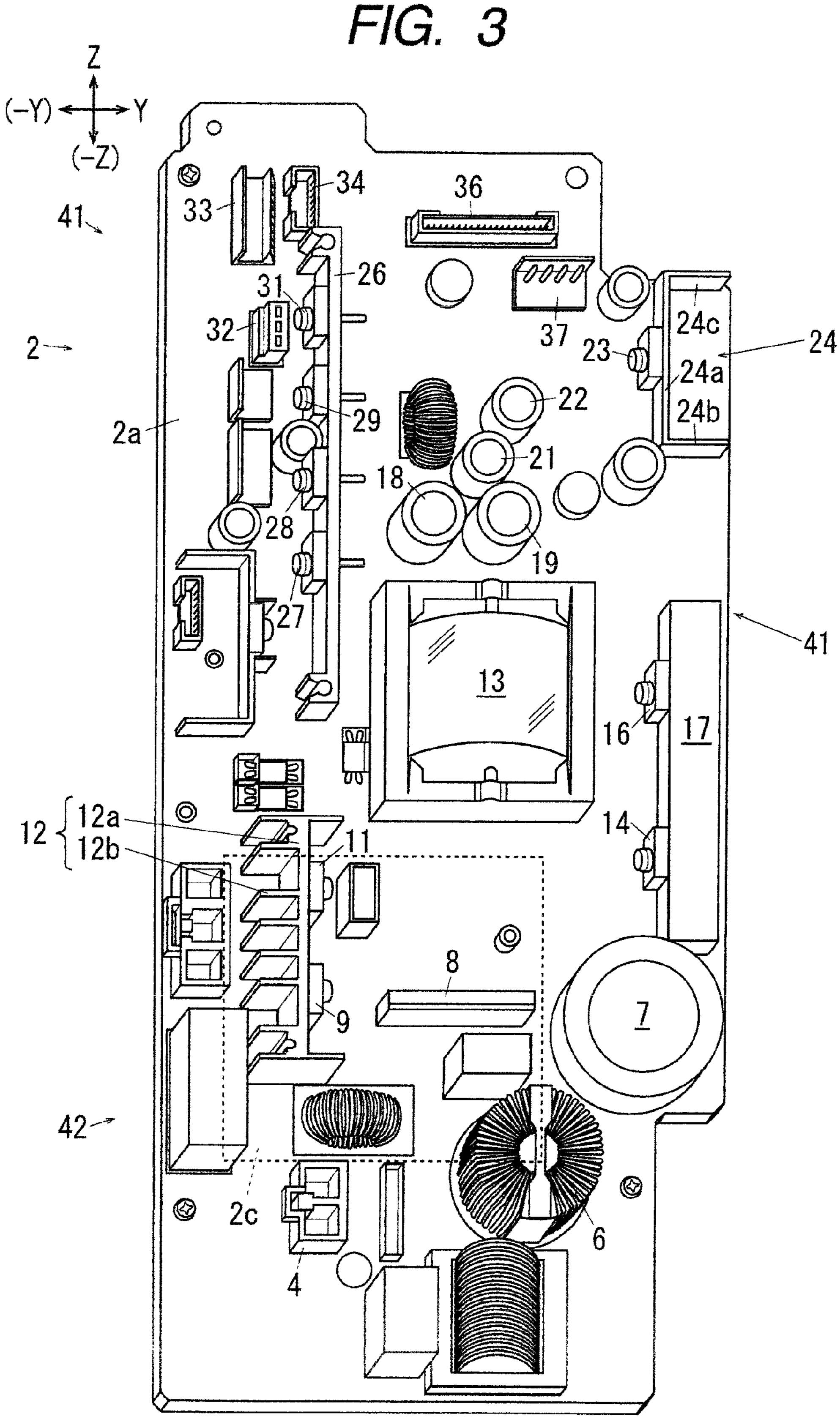
FIG. 3 is a view for explaining a power supply unit according to the first embodiment, in which a circuit board is viewed from front with a power supply cover being removed.

FIG. 3 is a view for explaining the power supply unit according to the first embodiment, in which the circuit board is viewed from front with the power supply cover being removed.

Figures 4A, 4B, 4C:
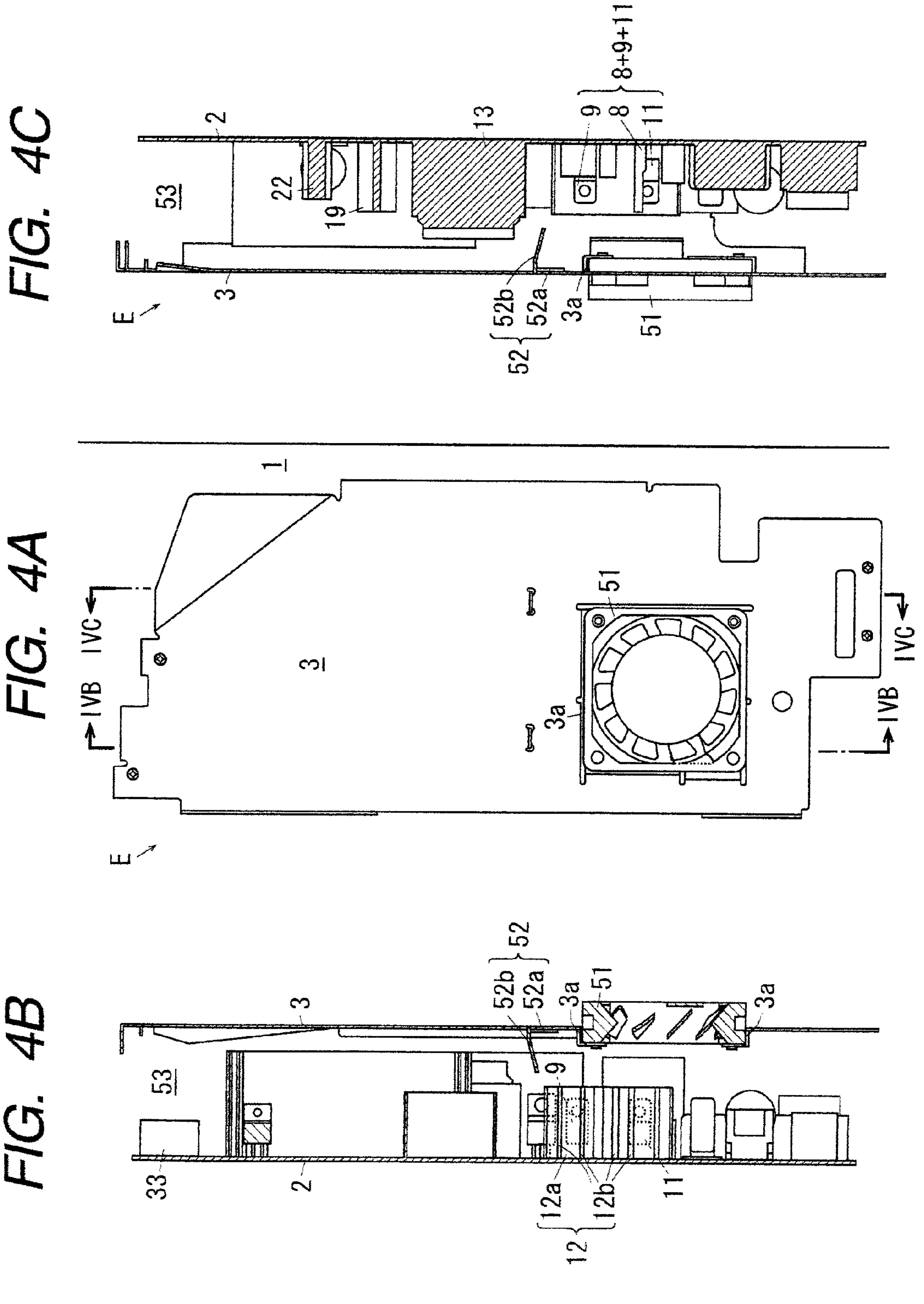

FIGS. 4A, 4B and 4C are views showing the relationship between the circuit board and the power supply cover according to the first embodiment. FIG. 4A is a front view. FIG. 4B is a sectional view taken on line IVB-IVB in FIG. 4A. FIG. 4C is a sectional view taken on line IVC-IVC in FIG. 4A.

In FIGS. 2 and 3, a front frame 1 is disposed under the tray cover TC1. The front frame 1 is an example of a front support frame of the image forming apparatus body U1. An air inlet 1*a* is formed in the upper right of the front frame 1. The air inlet 1*a* is an example of a refrigerant inflow opening. The power supply unit E is supported under the air inlet 1*a* of the front frame 1. In FIGS. 3 and 4A-4C, the power supply unit E has a plate-like circuit board 2 which is long in the up/down direction and a power supply cover 3 disposed oppositely to the circuit board 2. The power supply cover 3 is an example of an opposed member.

In FIG. 3, a device mounting surface 2*a* is formed in the circuit board 2. The circuit board 2 is supported on the front frame 1 in the condition that the device mounting surface 2*a* is arranged in the direction of gravity.

An input connector 4 is placed on the lower left side of the device mounting surface 2*a*. The input connector 4 is an example of an input wiring mounting member. AC power is supplied to the input connector 4 from outside the printer U, for example, from a home-use power outlet through not-shown wiring. A choke coil 6 is disposed on the right side of the input connector 4. The choke coil 6 is an example of a retardation device for retarding a high-frequency alternating current. A capacitor 7 is disposed on the upper right side of the choke coil 6. The capacitor 7 is an example of an electricity storage device for storing charges.

A driver 8 is disposed on the left side of the capacitor 7. The driver 8 is an example of a rectifying device for transforming an alternating current into a direct current. The driver 8 has a plate-like shape long in the left/right direction. The driver 8 is placed to stand erect on the device mounting surface 2*a*. Transformers 9 and 11 are arranged above and below each other on the left side of the driver 8. The transformers 9 and 11 are examples of transforming devices for voltage transformation. A first heat sink 12 is disposed on the left side of the transformers 9 and 11 while contacting with the transformers 9 and 11. The first heat sink 12 is an example of a heat release member for releasing heat of the circuit devices. The first heat sink 12 has a body portion 12*a* and fins 12*b*. The body portion 12*a* is long in the up/down direction and contacts with the transformers 9 and 11. The fins 12*b* are formed on the body portion 12*a* so as to protrude leftward. The fins 12*b* are examples of surface area increasing portions.

In FIG. 3, a large transformer 13 is disposed in a central portion of the device mounting surface 2*a*. Transistors 14 and 16 are arranged above and below each other on the right side of the large transformer 13. The transistors 14 and 16 are examples of amplification devices for amplifying an electric signal. A second heat sink 17 long in the up/down direction is disposed on the right side of the transistors 14 and 16 while contacting with the transistors 14 and 16.

Capacitors 18, 19, 21 and 22 are disposed above the large transformer 13. A regulator 23 is disposed on the right side of the capacitors 18-22. The regulator 23 is an example of a step-down stabilizer device for stepping down a voltage to stabilize the voltage. A third heat sink 24 is disposed on the right side of the regulator 23 while contacting with the regulator 23. The third heat sink 24 has a body portion 24*a* and heat release plates 24*b* and 24*c*. The body portion 24*a* is long in the up/down direction and contacts with the regulator 23. The heat release plates 24*b* and 24*c* are formed to protrude rightward from the opposite, upper and lower ends of the body portion 24*a*.

A fourth heat sink 26 long in the up/down direction is disposed on the left side of the capacitors 18-22. Transistors 27, 28, 29 and 31 are disposed on the left side of the fourth heat sink 26 while contacting with the fourth heat sink 26.

Output connectors 32, 33, 34, 36, 37 are disposed on the upper portion of the device mounting surface 2*a*. The output connectors 32, 33, 34, 36, 37 are examples of output wire mounting members, through which DC power is supplied to a sensor which is an example of a detection member, a motor which is an example of a driving source, a switch which is an example of a switching unit, another power supply unit such as a high-voltage power supply, etc.

Although various circuit devices and members other than the devices and members designated by the reference numerals 4-37 are mounted on the device mounting surface 2*a*, detailed description thereof will be omitted.

A first circuit device group 41 in the first embodiment is constituted by the circuit devices including the capacitors 18-22, the regulator 23 and the transistors 27-31. A second circuit device group 42 in the first embodiment is constituted by the circuit devices including the choke coil 6, the capacitor 7, the driver 8, the transformers 9 and 11, and the transistors 14 and 16.

Of the circuit devices and members designated by the reference numerals 4-37, the circuit devices designated by the reference numerals 6-11, 13-16, 18-23 and 27-31 but excluding the various connectors 4 and 32-37 and the various heat sinks 12, 17, 24 and 26 are electrically connected through wirings formed in the circuit board 2 so that AC power supplied from the input connector 4 is transformed into constant-voltage DC power, which is outputted through the output connectors 32-37.

Due to the transformation, the circuit device groups 41 and 42 generate heat. The heat value of the second circuit device group 42 in operation is higher than the heat value of the first circuit device group 41 in operation.

That is, in the circuit board 2 according to the first embodiment, the first circuit device group 41 comparatively low in heat value is disposed on the upper side of the device mounting surface 2*a*, while the second circuit device group 42 high in heat value is disposed on the lower side of the device mounting surface 2*a*. In addition, of the second circuit device group 42, the choke coil 6, the driver 8 and the transformers 9 and 11 are disposed in an exhaust outlet-projected region 2*c* which is set in the circuit device mounting surface 2*a* in advance. In the first embodiment, of the first heat sink 12 contacting with the transformers 9 and 11, a lower portion accounting for 80% in the up/down direction is also disposed in the exhaust outlet-projected region 2*c*.

In the first embodiment, the driver 8 and the transformers 9 and 11 are set as a to-be-cooled device 8+9+11 in advance.

In FIGS. 2 and 4A-4C, the power supply cover 3 of the power supply unit E is supported on the front frame 1 while covering the circuit board 2 so as to protect the circuit devices on the circuit board 2. In the lower portion of the power supply cover 3, a fan mounting portion 3*a* is formed in a position opposed to the exhaust outlet-projected region 2*c* of the circuit board 2 shown in FIG. 3. The fan mounting portion 3*a* is an example of a refrigerant exhaust outlet. An exhaust fan 51 is supported on the fan mounting portion 3*a*. The exhaust fan 51 is an example of an exhaust device.

In FIGS. 4A-4C, a wind direction guide plate 52 is supported on an upper portion of the fan mounting portion 3*a*. The wind direction guide plate 52 is an example of a protruding member and an example of a guide member. The wind direction guide plate 52 has a plate-like supported portion 52*a* long in the left/right direction, and a guide and shield portion 52*b* extending to protrude obliquely downward from an upper end of the supported portion 52*a* toward the to-be-cooled device 8+9+11.

An air cooling space 53 which is an example of a passage space is formed out of a space between the power supply cover 3 and the device mounting surface 2*a*. An upper end of the air cooling space 53 is connected to the air inlet 1*a* disposed above the air cooling space 53.

Thus, the air taken into the power supply unit E through the air inlet 1*a* passes through the air cooling space 53 from up to down in the direction of gravity while taking heat from the circuit devices etc. The air is an example of the refrigerant. The air is exhausted to the outside of the power supply unit E by the exhaust fan 51 disposed in the lower portion of the air cooling space 53.

The power supply unit E in the first embodiment is constituted by the air inlet 1*a*, the circuit board 2, the power supply cover 3, the exhaust fan 51, the wind direction guide plate 52, the circuit devices and members designated by the reference numerals 4-37, etc.

Operation of First Embodiment

The printer U according to the first embodiment having the aforementioned configuration is connected to an external power supply. When AC power of the external power suppler is supplied to the input connector 4 of the power supply unit E, the AC power is transformed into constant-voltage DC power by the circuit devices 6-11, 13-16, 18-23, 27-31, etc., and the DC power is supplied to the sensor, the motor, the switch, the high-voltage power supply unit, etc. through the output connectors 32-37. On this occasion, the air inside the power supply unit E is exhausted by the exhaust fan 51 of the power supply unit E while the air outside the power supply unit E is taken in to cool the power supply unit E. That is, when the air flowing from the air inlet 1*a* reaches the air cooling space 53, the air passes through the air cooling space 53 from up to down in the direction of gravity while taking heat from the circuit devices so as to cool the circuit devices. The air increased in temperature thus is then exhausted from the air cooling space 53 by the exhaust fan 51.

Figures 5A, 5B, 5C:
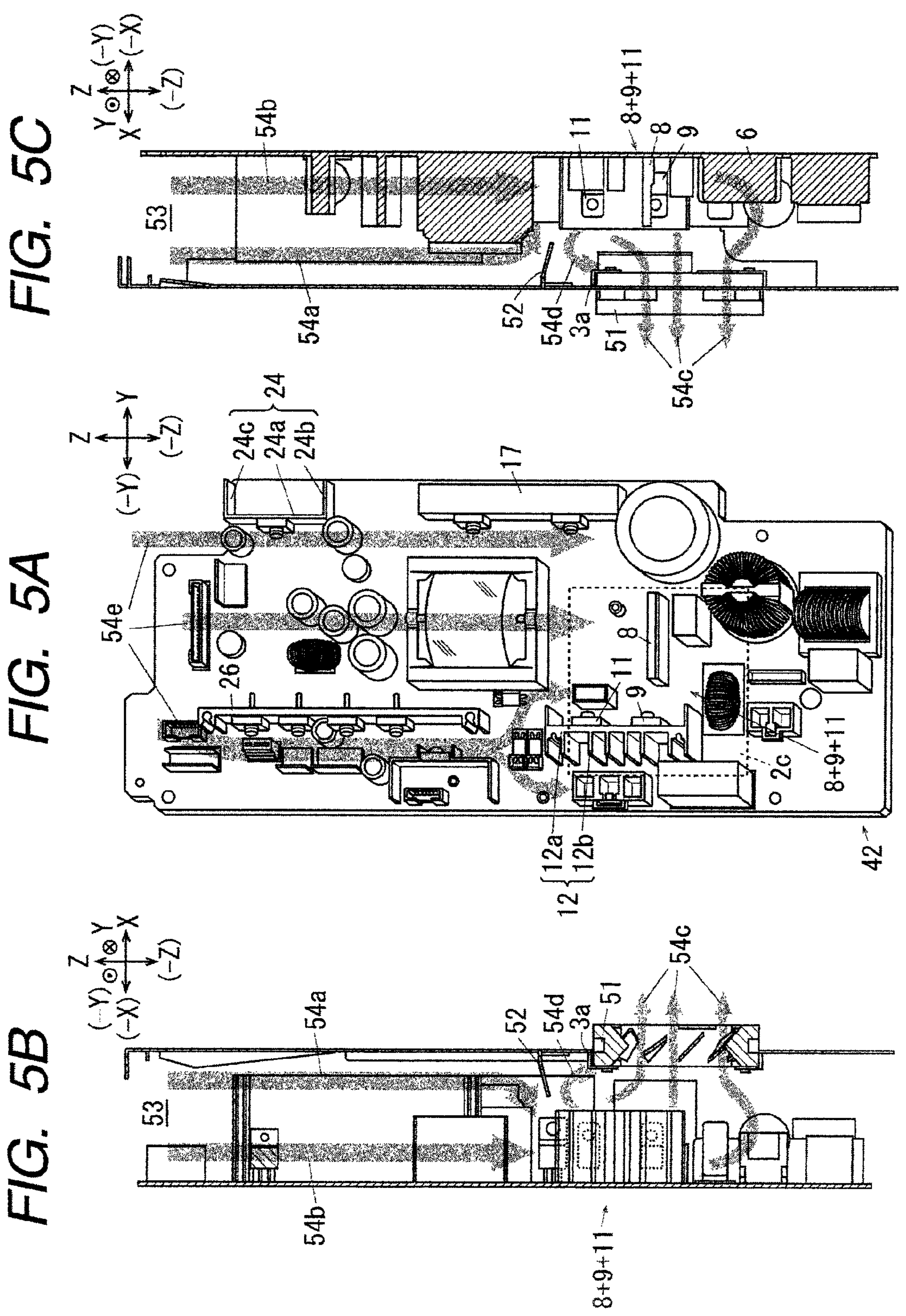

FIGS. 5A, 5B and 5C are views showing the flow of the air according to the first embodiment and explaining the operation of the air flow. FIG. 5A is a view corresponding to FIG. 3. FIG. 5B is a view corresponding to FIG. 4B. FIG. 5C is a view corresponding to FIG. 4C.

In FIGS. 5B and 5C, the air flowing downward along the power supply cover 3 in the air cooling space 53 on this occasion is guided toward the to-be-cooled device 8+9+11 by the wind direction guide plate 52 supported on the power supply cover 3, as shown by an arrow 54*a*. Thus, the air cools the second circuit device group 42 including the to-be-cooled device 8+9+11.

That is, in the printer U according to the first embodiment, the to-be-cooled device 8+9+11 is cooled by the air flowing on the device mounting surface 2*a* side as shown by an arrow 54*b* and the air guided from the power supply cover 3 side by the wind direction guide plate 52 as shown by the arrow 54*a*, in FIGS. 5B and 5C. Thus, the to-be-cooled device 8+9+11 is cooled more efficiently than in the case where the wind direction guide plate 52 is not provided.

For example, assume that the wind direction guide plate 52 is produced by so-called cutting and bending. That is, a U-shaped cut is made in the power supply cover 3. The portion sectioned by the cut is bent and raised with respect to the other portion of the power supply cover 3. In this case, there is the possibility that the cooling efficiency may deteriorate because a part of the air which is supposed to be guided to the to-be-cooled device 8+9+11 by the wind direction guide plate 52 may drop out on the way to the to-be-cooled device 8+9+11 through the hole of the power supply cover 3 made under the wind direction guide plate 52 by cutting and bending. However, the wind direction guide plate 52 according to the first embodiment is produced out of another material than the power supply cover 3 and supported on the power supply cover 3. Thus, the wind direction guide plate 52 is formed to prevent the air from dropping out.

In addition, in the printer U according to the first embodiment, the air flows from the upper portion where the first circuit device group 41 comparatively low in heat value is disposed toward the lower portion where the second circuit device group 42 higher in heat value than that of the first circuit device group 41 is disposed. The air thereby becoming hot is exhausted by the exhaust fan 51 without staying in the air cooling space 53 for a long time.

Particularly the to-be-cooled device 8+9+11, the first heat sink 12 contacting with the transformers 9 and 11, etc. are disposed in the exhaust outlet-projected region 2*c*. The air guided by the wind direction guide plate 52 cools the to-be-cooled device 8+9+11, the first heat sink 12, etc. to be thereby increased in temperature. The air increased in temperature thus is immediately exhausted to the outside of the air cooling space 53 by the exhaust fan 51 disposed in front of the exhaust outlet-projected region 2*c*, as shown by arrows 54*c* in FIGS. 5B and 5C.

Thus, in the printer U according to the first embodiment, the to-be-cooled device 8+9+11 is cooled efficiently because the possibility that the air becoming hot due to high-temperature circuit devices may heat low-temperature members during travelling is reduced, in comparison with the case where circuit devices which are so high in heat value that their temperature becomes high easily are disposed away from the fan mounting portion 3*a* on which the exhaust fan 51 is supported.

On this occasion, the air traveling from the upper portion of the air cooling space 53 does not flow directly under the wind direction guide plate 52, but cools the to-be-cooled device 8+9+11 etc. to be thereby increased in temperature, and then tries to move up. However, the air increased in temperature thus is impeded from moving up by the wind direction guide plate 52 and the impeded air is guided by the exhaust fan 51 as shown by an arrow 54*d* in FIGS. 5B and 5C. That is, the air increased in temperature is easily exhausted in a short time so that cooling can be performed efficiently in comparison with the case where the wind direction guide plate 52 is not provided above the fan mounting portion 3*a*.

Further, in FIG. 5A, in the printer U according to the first embodiment, the heat sinks 12, 17, 24 and 26 are disposed in the up/down direction, while the fins 12*b* and the heat release plates 24*b* and 24*c* are disposed to face outside in the left and right directions respectively. Thus, the air flowing in the air cooling space 53 moves left and right due to heat received from the fins 12*b* and the heat release plates 24*b* and 24*c*, but flows downward along the heat sinks 12-26. Particularly the air flowing in the left/right-direction central portion where the wind direction guide plate 52 is disposed is hardly impeded by the heat sinks 12-26 but flows downward as shown by arrows 54*e* in FIG. 5A. Thus, the air taken in from the air inlet 1*a* reaches the to-be-cooled device 8+9+11 in a short time and the air in the air cooling space 53 is replaced in a short time so that cooling can be performed efficiently in comparison with the case where the heat sinks 12-26 are not disposed in the up/down direction.

On this occasion, the first heat sink 12 disposed in the up/down direction in the exhaust outlet-projected region 2*c* releases heat in the configuration in which the first heat sink 12 has a height from the device mounting surface 2*a*. Thus, the air increased in temperature by the first heat sink 12 is easily exhausted by the exhaust fan 51 so that cooling can be performed efficiently.

MODIFICATIONS

The embodiment of the invention has been described above. However, the invention is not limited to the embodiment but can be changed variously within the gist of the invention stated in the scope of claims. Modifications (H01) to (H07) of the invention will be shown below by way of example.

(H01) In the aforementioned embodiment, the printer U has been shown as an example of the image forming apparatus. However, the invention is not limited to the printer but can be applied to a copying machine, a fax machine, a composite machine having these functions, or the like. In addition, the invention is not limited to an electronographic image forming apparatus but can be applied to an image forming apparatus of any image forming system, such as a printing machine of a lithographic system such as an inkjet recording system, a thermal head system, or the like. In addition, the invention is not limited to a monochrome-development image forming apparatus, but can be applied to a multi-color, so-called color image forming apparatus.

(H02) In the aforementioned embodiment, configuration where the power supply unit E as an example of the electronic unit is applied to the image forming apparatus has been shown by way of example. However, the invention is not limited thereto. As other examples of the electronic unit, the invention can be applied to electronic units of electric equipment such as a television as an example of a video display apparatus, a video playback apparatus using a recorded medium, a refrigerator, a washing machine, or the like.

(H03) In the aforementioned embodiment, configuration where air is taken in from the air inlet 1*a* and flows through the air cooling space 53 due to exhaust of air by the exhaust fan 51 has been described by way of example. However, configuration can be made so that another fan for taking in air from the air inlet 1*a* and making the air flow toward the air cooling space 53 is provided in the upper portion so as to increase the flow rate of the air flowing through the air cooling space 53.

(H04) In the aforementioned embodiment, the to-be-cooled device 8+9+11 is constituted by the driver 8 and the transformers 9 and 11. However, the invention is not limited thereto, but any desirable circuit devices may be formed as a to-be-cooled device.

(H05) In the aforementioned embodiment, circuit devices constituted by the first circuit device group 41 and the second circuit device group 42 have been described by way of example. However, the invention is not limited thereto, but may be applied to configuration in which the first circuit device group 41 is omitted so that circuit devices are constituted by only the second circuit device group 42 including a to-be-cooled device. That is, the invention may be applied to configuration in which any desirable circuit devices on the circuit board 2 are formed as a to-be-cooled device while the exhaust fan 51 and the wind direction guide plate 52 are provided.

(H06) In the aforementioned embodiment, the configuration where one exhaust fan 51, one wind direction guide plate 52, etc. are installed has been described by way of example. However, the invention is not limited thereto, but may be applied to configuration in which a plurality of exhaust fans 51, a plurality of wind direction guide plates 52, etc. are installed. When a plurality of exhaust fans 51 are provided, wind direction guide plates 52 may be installed correspondingly to the exhaust fans 51 respectively, or only one wind direction guide plate 52 may be installed.

(H07) In the aforementioned embodiment, it is preferable that the heat sinks 12-26 are disposed in the up/down direction. However, the invention can be applied to configuration in which the heat sinks 12-26 are not disposed in the up/down direction.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention defined by the following claims and their equivalents.

What is claimed is:

1. An electronic unit comprising:

a circuit board that has a device mounting surface mounted with circuit devices and that is supported in a condition that the device mounting surface is arranged vertically;

an opposed member that is disposed in opposition to the circuit board so that a passage space through which cooling air for cooling the circuit devices passes is formed between the opposed member and the device mounting surface;

an exhaust unit provided in the opposed member that is disposed in opposition to the circuit devices disposed on the circuit board and that exhausts the cooling air having passed through the passage space; and a protruding member that is provided above the exhaust unit vertically and that protrudes from the opposed member toward the circuit devices.

2. An electronic unit comprising:

a circuit board that has a device mounting surface mounted with circuit devices and that is supported in a condition that the device mounting surface is arranged vertically;

an opposed member that is disposed in opposition to the circuit board so that a passage space through which cooling air for cooling the circuit devices passes is formed between the opposed member and the device mounting surface;

an exhaust unit provided in the opposed member that is disposed in opposition to the circuit devices disposed on the circuit board and that exhausts the cooling air having passed through the passage space; and a guide member that is disposed above the exhaust unit vertically, the guide member by which the cooling air traveling downward vertically in the passage space is guided to the circuit devices while the cooling air traveling upward vertically in the passage space is guided to the exhaust unit.

3. An electronic unit comprising:

a circuit board that has a device mounting surface mounted with circuit devices and that is supported in a condition that the device mounting surface is arranged vertically;

an opposed member that is disposed in opposition to the circuit board so that a passage space through which cooling air for cooling the circuit devices passes is formed between the opposed member and the device mounting surface;

an exhaust unit provided in the opposed member that is disposed in opposition to the circuit devices disposed on the circuit board and that exhausts the cooling air having passed through the passage space; and a guide member that is disposed above the exhaust unit vertically, the guide member by which the cooling air traveling downward vertically in the passage space is guided to the circuit devices while the cooling air traveling upward vertically in the passage space is prevented from moving upward vertically with respect to the exhaust unit.

4. The electronic unit according to claim 1, wherein the circuit board has:

a first circuit device group that has at least one circuit device and that is disposed in an upper portion of the device mounting surface vertically; and a second circuit device group that has at least one circuit device comprising a to-be-cooled device disposed in opposition to the exhaust unit, that is higher in heat value than the first circuit device group, and that is disposed in a lower portion of the device mounting surface vertically.

5. The electronic unit according to claim 2, wherein the circuit board has:

a first circuit device group that has at least one circuit device and that is disposed in an upper portion of the device mounting surface vertically; and a second circuit device group that has at least one circuit device comprising a to-be-cooled device disposed in opposition to the exhaust unit, that is higher in heat value than the first circuit device group, and that is disposed in a lower portion of the device mounting surface vertically.

6. The electronic unit according to claim 3, wherein the circuit board has:

a first circuit device group that has at least one circuit device and that is disposed in an upper portion of the device mounting surface vertically; and a second circuit device group that has at least one circuit device comprising a to-be-cooled device disposed in opposition to the exhaust unit, that is higher in heat value than the first circuit device group, and that is disposed in a lower portion of the device mounting surface vertically.

7. An image forming apparatus comprising:

the electronic unit according to claim 1; and an image recording portion that records an image on a medium.

8. An image forming apparatus comprising:

the electronic unit according to claim 2; and an image recording portion that records an image on a medium.

9. An image forming apparatus comprising:

the electronic unit according to claim 3; and an image recording portion that records an image on a medium.

* * * * *